United States Patent
Legrand

(10) Patent No.: US 11,358,373 B2
(45) Date of Patent: Jun. 14, 2022

(54) SUNROOF FOR A MOTOR VEHICLE

(71) Applicant: AGC GLASS EUROPE, Louvain-la-Neuve (BE)

(72) Inventor: Denis Legrand, Wargnies le Grand (FR)

(73) Assignee: AGC GLASS EUROPE, Louvain-la-Neuve (BE)

( * ) Notice: Subject to any disclaimer, the term of this patent is extended or adjusted under 35 U.S.C. 154(b) by 506 days.

(21) Appl. No.: 14/409,262

(22) PCT Filed: Jun. 12, 2013

(86) PCT No.: PCT/EP2013/062095
§ 371 (c)(1),
(2) Date: Dec. 18, 2014

(87) PCT Pub. No.: WO2013/189790
PCT Pub. Date: Dec. 27, 2013

(65) Prior Publication Data
US 2015/0165729 A1  Jun. 18, 2015

(30) Foreign Application Priority Data
Jun. 19, 2012  (BE) .................................. 2012/0413

(51) Int. Cl.
*B32B 17/10*  (2006.01)
*B60J 7/043*  (2006.01)
(Continued)

(52) U.S. Cl.
CPC .... *B32B 17/10036* (2013.01); *B32B 17/1011* (2013.01); *B32B 17/10091* (2013.01);
(Continued)

(58) Field of Classification Search
CPC ..... B32B 17/10036; B32B 17/10009–17/1099
See application file for complete search history.

(56) References Cited

U.S. PATENT DOCUMENTS

| 4,124,733 A | * | 11/1978 | Melling | ............ B32B 17/10036 |
| | | | | 156/106 |
| 5,332,888 A | * | 7/1994 | Tausch | .................... B32B 17/10 |
| | | | | 219/203 |

(Continued)

FOREIGN PATENT DOCUMENTS

| BE | 1 013 036 A4 | 8/2001 |
| EP | 0418 123 A1 | 3/1991 |

(Continued)

OTHER PUBLICATIONS

English translation Kramling et al., EP0418123.*
(Continued)

*Primary Examiner* — Niki Bakhtiari
(74) *Attorney, Agent, or Firm* — Oblon, McClelland, Maier & Neustadt, L.L.P.

(57) ABSTRACT

The invention relates to a sunroof for a motor vehicle including two glass sheets (1, 3) joined together by a thermoplastic insert (2), wherein the sheet (1) directed toward the outside is annealed, and the sheet (3) directed toward the inside is made of tempered glass, the total thickness of the glass sheets being no greater than 5 mm, and preferably no greater than 4.5 mm.

21 Claims, 1 Drawing Sheet

(51) Int. Cl.
  *H01L 31/048* (2014.01)
  *H01L 31/056* (2014.01)
  *B62D 25/06* (2006.01)

(52) U.S. Cl.
  CPC .. *B32B 17/10229* (2013.01); *B32B 17/10339* (2013.01); *B32B 17/10532* (2013.01); *B32B 17/10633* (2013.01); *B32B 17/10761* (2013.01); *B60J 7/043* (2013.01); *H01L 31/048* (2013.01); *H01L 31/0488* (2013.01); *H01L 31/056* (2014.12); *B62D 25/06* (2013.01); *Y02E 10/52* (2013.01); *Y10T 428/24628* (2015.01)

(56) References Cited

U.S. PATENT DOCUMENTS

| | | | |
|---|---|---|---|
| 6,361,101 | B1 | 3/2002 | Yoshizawa |
| 6,538,192 | B1* | 3/2003 | Coster ............... B32B 17/10036 428/426 |
| 2002/0106519 | A1* | 8/2002 | Takahara .......... B32B 17/10036 428/426 |
| 2004/0219368 | A1* | 11/2004 | Coster .................... B32B 17/10 428/432 |
| 2006/0134438 | A1 | 6/2006 | Coster et al. |
| 2008/0318028 | A1 | 12/2008 | Winstanley et al. |
| 2009/0098354 | A1 | 4/2009 | Torr |
| 2009/0219468 | A1* | 9/2009 | Barton .................... B32B 17/10 349/104 |

FOREIGN PATENT DOCUMENTS

| | | |
|---|---|---|
| EP | 0 908 302 A2 | 4/1999 |
| FR | 2 775 282 A1 | 8/1999 |
| WO | 01/02167 A1 | 1/2001 |
| WO | 2005/115747 A1 | 12/2005 |
| WO | 2007/077460 A1 | 7/2007 |
| WO | 2007/093828 A1 | 8/2007 |

OTHER PUBLICATIONS

International Search Report dated Sep. 2, 2013 in PCT/EP2013/062095 filed Jun. 12, 2013.
U.S. Appl. No. 14/409,197, filed Dec. 18, 2014, Legrand, et al.
U.S. Appl. No. 11/317,717, filed Dec. 23, 2005, Coster, et al.

* cited by examiner

SUNROOF FOR A MOTOR VEHICLE

The invention relates to vehicle roofs formed, at least in part, from a laminated glazing unit.

The use of laminated roof glazing units has been proposed previously, in particular for giving these roofs particular optical properties. By way of indication, roofs of this type targeting colorimetric properties are presented in patent EP 1 200 256 B.

Apart from the optical properties, the roofs must also have mechanical characteristics that align them with those of conventional metal roofs. Within this meaning, the aforementioned document proposes in particular the choice of laminates comprising toughened or semi-toughened sheets. These roofs reinforce the rigidity without risk of breakage under the stresses to which they are subjected.

Glass sheets that are toughened or semi-toughened usually retain traces of these treatments. In the handling thereof, glass brought to high temperature, above 600° C., is cooled even more rapidly when the toughening must be more intense. Similarly, the toughening must be even more intense when the glass sheet is thinner in order to create the temperature gradient necessary for creating the stresses between the surface of the sheet and the core thereof.

The most common toughening techniques comprise blowing air at ambient temperature from a multiplicity of nozzles. The impact of the air jets on the glass sheet cannot disregard a certain localization on this sheet. The result of this distribution of the impacts is the appearance of what is denoted by the term "stress pattern". These marks, which do not normally introduce optical defects in transmission, can nevertheless be seen in reflection in the form of iridescence clearly visible under certain incidences of observation. Viewing the roofs from the outside is normally at low angles of incidence that clearly reveal these stress patterns.

The toughening operation is also often carried out by making the previously shaped sheet pass over a series of conveyor rollers. The cooling air is blown onto the sheet during this transport. In this case, the glass sheet often retains the mark of contact with the rollers.

In order to prevent what manufacturers consider to be detrimental to the aesthetics, the invention proposes laminated roofs, the glass sheet of which turned toward the outside of the vehicle has not undergone toughening. In other words, the corresponding sheets are simply annealed. The sheets in question, after thermal shaping treatments, are slowly cooled so that the temperature difference between the surface of the sheet and the core thereof remains relatively small and so that the stresses of thermal origin are also limited.

In the formation of the sheets that are incorporated into the composition of the roof, these sheets are normally slightly bent. It is therefore on leaving the bending operation that the cooling is carried out. In practice, the is cooling of the sheets may be accelerated as indicated above in order to create stresses. Conversely, if it is desired to prevent or limit the stresses, the cooling is just maintained so that the part no longer deforms, which usually consists in leaving it in contact with ambient air without forced convection.

As recalled above, in the prior art the choice of toughened sheets in laminated glazing units has the objective of imparting rigidity and, even more, resistance to flexural stresses. It is proposed according to the invention to retain this property by combining, with the hardened glass sheet positioned toward the outside, a toughened glass sheet turned toward the passenger compartment.

The roof glazing units are usually bonded to the structure of the vehicle in order to be able to be mounted flush therewith, in other words in the continuation of the neighbouring bodywork parts, without a recess. The bonding is carried out on the inner sheet. It is this sheet that first must withstand the stresses. The choice of the use of a toughened sheet is consequently preferable.

One requirement of manufacturers recalled in the aforementioned application is also to lighten the vehicles. The use of glazed roofs instead of metal roofs leads to overloading which it is necessary to limit as much as possible. For this reason, the thickness of the laminated glazing unit must also be kept as thin as is permitted while maintaining the necessary mechanical properties mentioned above.

Most commonly, in the prior embodiments, the sheets used for the laminated roofs are of identical thicknesses. The shaping of the sheets is thereby facilitated. The bending may be carried out in a single operation, both sheets being superposed, in order to ensure a good match. This shaping may also be achieved by toughening, which then affects both sheets.

For the reasons stated above, although both glass sheets must be of the same shape in order to result in a defect-free assembly, on the other hand their respective role means that they may be different. In particular, for a given total thickness, the two sheets are advantageously of different thickness. According to the invention, the sheet that is positioned toward the inside, which sheet, being in contact with the structure of the vehicle, must directly withstand the stresses, is preferably the thicker of the two.

Given that the total thickness must remain limited, increasing the thickness of the toughened or semi-toughened inner sheet leads to a reduction of the thickness of the outer sheet. This arrangement may appear paradoxical insofar as the external hazards, sprays of gravel in particular, could lead, for reasons of resistance to these impacts, to a thicker outer sheet being favored. Nevertheless, experimentation has shown that the risk of breakage caused by impact is substantially lower on the roofs in comparison with what is observed for example on the windshield due to the very reason of the position of these glazing units. Consequently, a smaller thickness of the outer sheet is not prejudicial.

Furthermore, the difference in impact resistance between annealed glass and toughened glass is not very significant, so that the choice of an annealed sheet is not contraindicated either.

It results from specific features of the invention stated above that the sheets incorporated into the composition of the glazing units according to the invention are shaped separately. This method usually is not preferred due to small differences in shape that may appear. In the case of the invention, the fact of combining two sheets of different thicknesses, one of which is relatively thin, makes possible an assembly that has a minimum risk of delamination. Limited conformational differences are more easily compensated for in the assembly, the thinnest sheet being driven to match the shape of the thickest sheet under very limited stresses.

The glazing units according to the invention being used for a motor vehicle roof advantageously have a total glass thickness which is not greater than 5 mm, and preferably which is not greater than 4.5 mm.

This thickness may be even more limited when the dimensions of the glazing unit are smaller. For glazing units of 1 m² or more, it is preferred to retain a thickness that is not less than 3.5 mm.

The outer sheet, even of limited thickness, is preferably at least 1 mm and is not greater than 2.2 mm. Its thickness is preferably between 1.2 and 1.8 mm.

The inner, necessarily thicker sheet is at least 1.9 mm and at most 3.5 mm and preferably between 2 and 3 mm.

The ratio between the thicknesses of the outer and inner sheets is not greater than 0.8 and preferably not greater than 0.6. It may be as low as 0.3.

The toughened glass sheets used according to the invention are such that they meet the requirements of the standard ECE R43. In other words, the toughened glass sheets, when they break under the conditions of the standard, result in a given number of fragments that also have given dimensions and shapes.

The intensity of the toughening that results in these properties, is a function of the thickness of the sheets in question. Specifically, it is a question of ensuring that the surface stresses reach a certain intensity. These stresses depend on the cooling rate imposed at the surface relative to the cooling undergone at the core of the sheet. The thinner the sheet, the more difficult it is to obtain the temperature imbalance. The choice according to the invention of the thickest toughened sheet does not raise particular difficulties in this respect. In practice, the toughening operations are controlled so that, for sheets having thicknesses that meet the conditions stated above, the central surface stress is not less than 30 MPa and preferably is not less than 50 MPa and may exceed 60 MPa.

The glass sheets that have not undergone toughening have, by comparison, very low stress levels. For these glass sheets, the central surface stresses preferably do not exceed 10 MPa and advantageously do not exceed 5 MPa.

As indicated above, the fact of having a relatively thin non-toughened sheet on the outside is even more preferable since the toughening is more difficult for glass that is not very thick. For this glass, after forming, the cooling is carried out in contact simply with the ambient air.

The glass sheets are assembled in a conventional manner by means of thermoplastic interlayers. Most commonly these are sheets of polyvinyl butyral (PVB), but other materials, especially ethylene/vinyl acetate (EVA) copolymers or polyvinyl chlorides (PVCs) may also be chosen. The thicknesses of these interlayers are conventionally of the order of 0.3 to 1.5 mm. For PVB sheets, the common commercial thicknesses are 0.38 mm and 0.76 mm.

As for windshields, the interlayer sheet guarantees that fragments of the glass sheets will remain in place in the event of breakage. The thickness chosen for the interlayer also guarantees a resistance to ejection in the event of an accident. The effect of the interlayer on the weight of the glazing unit is much less than that of the thickness of the glass sheets. Therefore, the choice of the thickness is firstly governed by the considerations indicated above.

It goes without saying that the roofs according to the invention have optical properties such as those described in the aforementioned patent. Their light transmission (LT), their energy transmission (ET), their selectivity (LT/SF, SF solar factor is the sum of the direct energy transmission and of that resulting from re-emission toward the inside after absorption by the glass) and also their color in transmission and in reflection must satisfy the multiple requirements of the manufacturers in this field. In order to meet these requirements, the choice of colored glass may be necessary. The color may also be obtained as a result of the use of colored interlayers combined with clear or colored glass.

For motor vehicle manufacturers, the choice of the color is very greatly oriented toward "neutral" colors, in particular for the colors in reflection that must match the bodywork colors. Neutral colors are generally grey or slightly blueish. Purple colors are conversely to be avoided.

In the colorimetric systems, the most common one is that of the International Commission on Illumination (abbreviated to CIE from its French name Commission internationale de l'eclairage). The colors are defined in particular in the CIEL*a*b* system and are measured under the illuminant D65/10°. In order to satisfy the choices indicated above, the glazing units according to the invention advantageously have, in reflection, the coordinate values:

$$-4<a^*<0 \text{ and } -3<b^*<0.$$

Likewise, according to the invention, the colorimetric coordinates in transmission are advantageously such that:

$$-4<a^*<0 \text{ and } -4<b^*<0.$$

The presence of wide glazed surfaces in the roofs of vehicles requires particular attention as regards thermal comfort. In particular, it is necessary to prevent these roofs from leading to a greenhouse effect during exposure to solar radiation. As is known, apart from the control resulting from the use of colored glass that absorbs a portion of the radiation, the glazing units in question may comprise systems of thin layers that selectively reflect the infrared rays.

In order to maintain a certain thermal comfort, it is preferable that the energy transmission does not exceed 25% of the energy of the incident radiation, and preferably is at most equal to 15%. When using the glazing units, it is necessary to take into account the fact that a large part of the energy transmitted is transmitted by the visible radiation. For this reason, controlling the energy transmission results in the transmission in the visible spectrum also being limited. In practice, the visible light transmission, LT, for the roofs in question is not greater than 50%, and most often does not exceed 35%.

Control of the light transmission is obtained firstly by the choice of colored glass and where appropriate of colored interlayer also.

The roofs of motor vehicles must also, where appropriate, fulfil other functions, or make it possible to adapt their function according to the usage conditions. Very often, it is proposed to take advantage of the roof of a vehicle and its exposure to solar radiation in order to install photovoltaic generators that contribute to the production of the electric current needed for the operation of the various systems and devices on board the vehicle.

The presence of photovoltaic cells incorporated into the roof is of course compatible with the provisions of the invention. The cells conventionally are positioned between the glass sheets, and are in the interlayer material formed from one or more sheets in, or between which, the cells are positioned.

If the roof comprises photovoltaic cells, it is preferable for the outer glass sheet to be as transparent as possible to UV rays. Clear or even extra-clear glass is advantageously used for this sheet. The fact of limiting the thickness of the outer sheet also constitutes an advantage insofar as the absorption is more limited therein.

Other devices are also optionally included in the laminated glass roofs. Passenger compartment lighting assemblies are thus often proposed. Such assemblies consist, for example, of series of LEDs. These assemblies, like the photovoltaic cells, are introduced into or between interlayer sheets, and are powered by an electric circuit usually consisting of an appropriate pattern made in conductive and transparent thin layers.

The roofs may also comprise assemblies that make it possible to control functions such as changing the light transmission. These are, for example, electrochromic assemblies which, via a change in chemical nature of the elements that they contain, darken and lighten under the effect of an electric field. They are also, optionally, compounds that modify the light transmission, not by chemical modification, but by acting on particle orientation properties under the effect also of an electric field, such as SPDs (suspended particle devices). The method of inserting such devices is described, for example, in publication WO 2005/102688.

The invention is described in detail by referring to the mosaics, in which.

Figure 1:
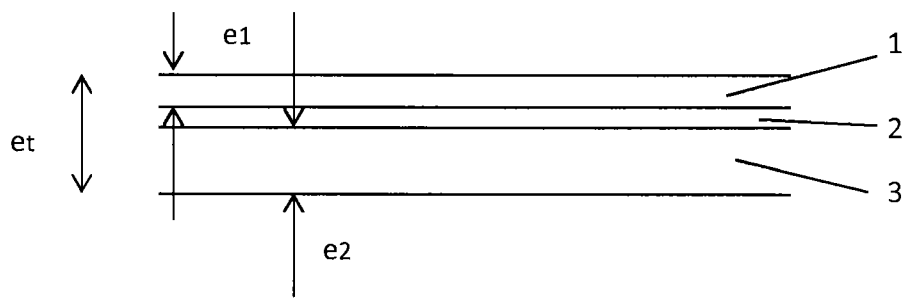
FIG. 1 represents, in schematic cross section, a roof glazing unit according to the invention.

FIG. 1 shows a laminated assembly comprising two glass sheets 1 and 2. The glass sheet 1 is intended to be exposed to the outside. This sheet has a thickness $e_1$. A second sheet 3 turned toward the inside of the vehicle has a thickness $e_2$ substantially greater than $e_1$. The two sheets are assembled in a conventional manner by means of an interlayer 3 composed of a thermoplastic sheet, most often a sheet of PVB or EVA.

The glass sheet 3, which is fixed to the structure of the vehicle, is made of toughened glass. The glass sheet 1, turned toward the outside, is annealed.

Since the glazing unit is intended to be incorporated in the composition of a roof, it normally has optical and energetic characteristics in connection with this use. One constant in this use is the need to control the heating of the vehicle when it is exposed to solar radiation. For this purpose, the roof must serve as a filter, in particular for infrared radiation, but also for a significant portion of the visible radiation. For these reasons, the glazing units are advantageously colored. In the laminated assemblies, preferably at least one of the glass sheets is colored.

In order to ensure thermal control, the glazing unit often comprises a system that selectively reflects the infrared rays. In particular, this system is thin layers applied to the glass sheets or to a support film that is added to the interlayer and is included therein.

Figure 2:
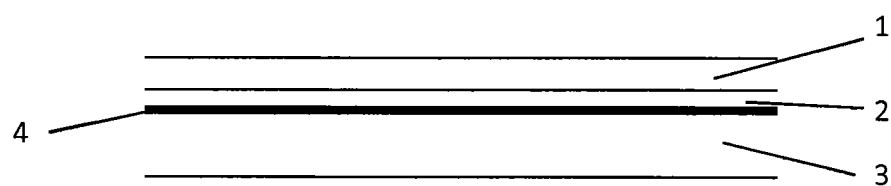
FIG. 2 is similar to the preceding figure, the glazing unit comprising means for modifying its optical-energetic properties.

Represented in FIG. 2 is a glazing unit comprising a system of thin layers 4, applied to the glass sheet 3. The systems of layers conventionally used in these laminates are in particular those comprising one or more metallic layers, especially based on silver, combined with dielectric layers that protect the metallic layers and make it possible to select the radiation reflected so that the glazing units do not have, especially in reflection, undesirable colors. The presence between the glass sheets guarantees these systems of layers against external chemical or mechanical risks. Constantly, the systems may be made with layers customarily described as "soft", layers formed in particular by sputtering. Although metallic thin layers are the most effective infrared filters, it is also possible to use layers consisting of oxides of the doped tin oxide type. The advantage of these layers is that they may be formed under advantageous economical conditions, for example by gas pyrolysis directly onto the ribbon of glass leaving the float process. It is also possible to use interlayers comprising particles that absorb the infrared rays, in particular particles embedded in the interlayer material. As is known, ITO (indium tin oxide) particles are used for these applications.

The glazing units forming the roofs of the vehicles are advantageously chosen so that their energy transmission ET is not greater than 25% of the energy of the incident radiation. Preferably, this transmission is as limited as possible. By combining the color of the glass sheets in order to give them a significant absorption, with, advantageously, reflective layers, the energy transmission may be reduced for example to 10% and less. This transmission is even lower when the transmission of the visible rays is itself lower.

In FIG. 2, the system of layers 4 is introduced onto the glass sheet 3. This arrangement is preferable when, in particular, photovoltaic cells are inserted between the two glass sheets and when it is preferable for the radiation transmitted to these cells to be as intense as possible. For other applications, such as that represented in FIG. 3, the system of layers is conversely positioned on sheet 1.

Figure 3:
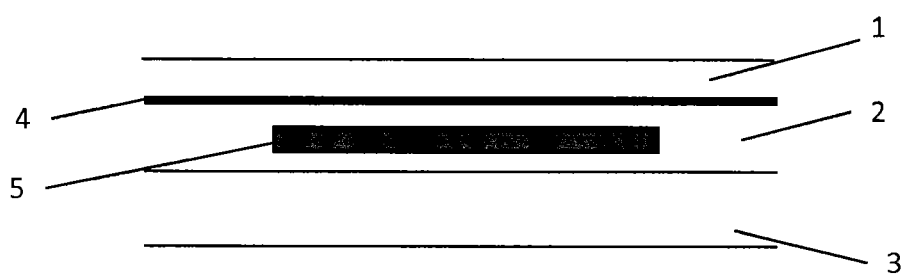
FIG. 3 is similar to the preceding figures, the glazing unit this time comprising additional functional elements introduced between the two glass sheets.

The embodiment represented in FIG. 3 is, for example, that corresponding to the insertion into the glazing unit of functional elements 5, the prolonged exposure of which to infrared radiation may lead to an alteration. A typical case is that formed by SPD films that modify the light transmission in a controlled manner. The nature of the suspended particles, the orientation of which makes it possible to modify the transmission, makes them particularly heat sensitive. It is therefore necessary to reduce as much as possible the infrared rays to which these films are exposed. In order to obtain this result, the glass sheet 1 may be colored and highly absorbent, but this leads to a significant limitation of the light transmission available in the passenger compartment, the SPD film itself reducing the transmission even in the "clear" state favorable to this transmission. The choice of a protection from infrared rays by means of a high-performance selective system of layers makes it possible to retain a greater light transmission.

The system of layers chosen is advantageously a system that contains a number of silver layers, in order to obtain an effective filter, and that allows color, especially in reflection, to be controlled. A particularly effective set of layers is as described in patent application WO 2011/147875. In this application, the recommended system comprises three silver layers and dielectric layers, the assembly being chosen, especially the thicknesses of the silver layers, such that the color in reflection is satisfactory even at low incidences of observation.

The invention claimed is:

1. A motor vehicle roof comprising:
   an annealed glass sheet having a thickness of less than 1.8 mm that has been annealed and configured to face an outside of the motor vehicle;
   a toughened glass sheet made of toughened glass and configured to face an inside of the motor vehicle; and
   a thermoplastic interlayer joining the annealed glass sheet and the toughened glass sheet, wherein,
   a total thickness of the annealed glass sheet, the toughened glass sheet, and the thermoplastic interlayer is not greater than 3.96 mm, and a ratio of a thickness of the annealed glass sheet to a thickness of the toughened glass sheet is between 0.3 and 06.

2. The motor vehicle roof as claimed in claim 1, wherein a thickness of the annealed glass sheet is at least 1 mm.

3. The motor vehicle roof as claimed in claim 1, wherein a thickness of the toughened glass sheet is at least 1.9 mm and at most 3 mm.

4. The motor vehicle roof as claimed in claim 1, wherein a central surface stress of the toughened glass sheet is not less than 30 MPa.

5. The motor vehicle roof as claimed in claim 1, wherein the annealed glass sheet has a central surface stress which is not greater than 10 MPa.

6. The motor vehicle roof as claimed in claim 1, wherein at least one of the annealed glass sheet and the toughened glass sheet is a colored glass sheet.

7. The motor vehicle roof as claimed in claim 1, further comprising a set of layers selectively reflecting a portion of incident infrared radiation,
wherein the set of layers selectively reflecting a portion of incident infrared radiation limits energy transmission through the motor vehicle roof such that, in combination with energy absorbed by the annealed and toughened glass sheets, the energy transmission through the motor vehicle roof is at most equal to 25%.

8. The motor vehicle roof as claimed in claim 7, wherein the set of layers selectively reflecting a portion of incident infrared radiation is supported by a transparent film introduced between the annealed and toughened glass sheets.

9. The motor vehicle roof as claimed in claim 7, wherein the thermoplastic interlayer comprises oxide particles that absorb infrared rays.

10. The motor vehicle roof as claimed in claim 9, further comprising, included in the thermoplastic interlayer, a set of photovoltaic cells and their associated conductors, the annealed sheet being made of clear glass or of extra-clear glass.

11. The motor vehicle roof as claimed in claim 10, wherein the system of layers selectively reflecting a portion of incident infrared radiation is located under the photovoltaic cells with respect to a path of incident solar radiation.

12. The motor vehicle roof as claimed in claim 7, comprising, included in the thermoplastic interlayer, an SPD film and associated conductors, controlling modification of light transmission, the set of layers selectively reflecting a portion of incident infrared radiation being positioned above the SPD film with respect to a path of incident solar radiation.

13. The motor vehicle roof as claimed in claim 12, wherein the set of layers selectively reflecting a portion of incident infrared radiation comprises a plurality of thin silver layers separated by dielectric layers.

14. The motor vehicle roof as claimed in claim 13, wherein the set of layers selectively reflecting a portion of incident infrared radiation comprises three silver layers.

15. The motor vehicle roof as claimed in claim 1, wherein a light reflection has colorimetric coordinates in the CIE L*a*b* system such that:

$$-4<a^*<0 \text{ and } -3<b^*<0.$$

16. The motor vehicle roof as claimed in claim 1, wherein a light transmission has colorimetric coordinates in the CIE L*a*b* system such that:

$$-4<a^*<0 \text{ and } -4<b^*<0.$$

17. The motor vehicle roof as claimed in claim 1, wherein a thickness of the annealed glass sheet is between 1.2 and 1.8 mm.

18. The motor vehicle roof as claimed in claim 1, wherein a central surface stress of the toughened glass sheet is not less than 50 MPa the annealed glass sheet has a central surface stress which is not greater than 5 MPa.

19. A motor vehicle roof comprising:
an annealed glass sheet having a thickness of less than 1.8 mm that has been annealed and configured to be part of a motor vehicle roof and face an outside of the motor vehicle;
a toughened glass sheet made of toughened glass and configured to be part of a motor vehicle roof and face an inside of the motor vehicle; and
a thermoplastic interlayer joining the annealed glass sheet and the toughened glass sheet,
wherein,
a total thickness of the annealed glass sheet, the toughened glass sheet, and the thermoplastic interlayer is not greater than 3.96 mm, and a ratio of a thickness of the annealed glass sheet to a thickness of the toughened glass sheet is not greater than 0.6.

20. The motor vehicle roof as claimed in claim 19, wherein the thermoplastic interlayer has a thickness of between 0.38 mm and 0.76 mm.

21. The motor vehicle roof as claimed in claim 19, wherein the thermoplastic interlayer has a thickness of 0.76 mm.

* * * * *